United States Patent [19]

Aoki et al.

[11] Patent Number: 4,596,044
[45] Date of Patent: Jun. 17, 1986

[54] UHF-VHF COMBINATION TUNER

[75] Inventors: Kazuharu Aoki; Masahiko Saito, both Alps Electric Co., Ltd., Japan

[73] Assignee: Alps Electric Co., Ltd., JPX

[21] Appl. No.: 541,519

[22] Filed: Oct. 13, 1983

[30] Foreign Application Priority Data

Oct. 13, 1982 [JP] Japan ............................ 57-154659[U]

[51] Int. Cl.$^4$ ............................ H04B 1/16; H03J 3/00
[52] U.S. Cl. .................................... 455/189; 455/190; 334/15; 334/47
[58] Field of Search ............... 455/180, 188, 190, 191, 455/333; 334/1, 15, 47

[56] References Cited

U.S. PATENT DOCUMENTS

| 4,160,213 | 7/1979 | Carter | 455/180 |
| 4,326,295 | 4/1982 | Matsumoto et al. | 455/188 |
| 4,404,686 | 9/1983 | Moon | 455/180 |

FOREIGN PATENT DOCUMENTS

| 2728710 | 1/1979 | Fed. Rep. of Germany | 455/190 |
| 120214 | 10/1978 | Japan | 455/188 |
| 13035 | 1/1983 | Japan | 455/188 |

Primary Examiner—Jin F. Ng
Attorney, Agent, or Firm—Guy W. Shoup

[57] ABSTRACT

A combination UHF-VHF tuner has a switching diode placed in series with a VHF high-range peaking coil so that the coil forms a parallel resonance peaking circuit when high-range VHF signals are received and the coil acts as a series impedance matching element when a UHF IF signal is coupled from a UHF mixer stage.

5 Claims, 3 Drawing Figures

UHF-VHF COMBINATION TUNER

BACKGROUND OF THE INVENTION

1. Field of the Invention

The present invention relates to a UHF-VHF combination tuner and particularly to a UHF-VHF combination tuner in which the impedance mismatching which may occur when a diode mixer is used in the UHF portion is corrected by utilizing a coil which serves as a peaking coil in the case of the VHF high channel reception.

2. Description of the Prior Art

Conventionally, such a UHF-VHF combination tuner as shown in FIG. 1 is known. In FIG. 1, reference numeral 1 designates an FET constituting a mixer stage as decribed later with respect to the invention; 2, a coil which serves as a peaking coil in the case of the VHF high channel reception; 3, a switching diode which is turned on in the case of the VHF high channel reception to thereby ground the above-mentioned coil 2 with respect to high frequencies; 4, 5, 6, 7, and 8, capacitors and inductances which constitute a UHF intermediate frequency tuning circuit; 9, a UHF mixer in the case of the UHF channel reception; 10, a DC voltage application terminal in the case of the VHF high channel reception; 11, a DC voltage application terminal in the case of the VHF low channel reception; 13, a VHF input signal input terminal; 17 a capacitor constituting a high frequency grounding circuit for the coil 2; 18, a UHF intermediate frequency input coupling capacitor having a function of DC blocking; 19, a UHF local oscillator circuit; 20, a UHF mixer tuning circuit; 21 and 22, biasing resistors; 23 and 24, resistors; and 25, 26 and 27, capacitors.

In the case as shown in FIG. 1, a fixed bias is provided to the mixer stage 1 through the resistors 21 and 22. The operation of this circuit is as follows:

[I] VHF Low Channel Reception:

A DC voltage is applied to the terminal 11 shown in the drawing so as to maintain the diode 3 in its off-state. A VHF input signal is supplied to the terminal 13 and at this time the UHF portion may be considered in its inoperative state. Under this condition, the coil 2 is made to be in its nongrounded state with respect to high frequencies and the mixer stage 1 operates as a mixer for the VHF channel.

[II] VHF High Channel Reception:

A DC voltage is applied to the terminal 10 shown in the drawing so as to maintain the diode 3 in its on-state. A VHF input signal is supplied to the terminal 13 and at this time the UHF portion may be considered in its inoperative state. Under this condition, the coil 2 is grounded with respect to high frequencies through the capacitor 17. Thus the coil 2 operates to constitute a parallel resonance circuit together with the input capacitance of the gate G1 of the mixer stage 1 to thereby improve the high band characteristic. That is, the mixer stage 1 which is provided to operate as a peaking coil is operating as a mixer for the VHF channel.

[III] UHF Channel Reception:

In this case, a UHF input signal is coupled to the UHF mixer 9 shown in the drawing through a not-shown arrangement. This UHF input signal is mixed in the mixer 9 with the frequency of the UHF local oscillator circuit 19 and then led to the UHF intermediate frequency tuning circuit constituted by the components 4, 5, 6, 7, and 8, through the UHF mixer tuning circuit 20. The UHF intermediate frequency passes through the UHF intermediate frequency tuning circuit and then supplied to the gate G1 of the mixer stage 1 through the capacitor 18. At this time, the mixer stage 1 operates as a UHF intermediate frequency amplifier.

Although the circuit as shown in FIG. 1 operates as described above, the matching between the intermediate frequency tuning circuit and the next stage including the mixer stage 1 is not sufficient and the noise factor is deteriorated in the case of UHF channel reception because the UHF mixer 9 employing a diode in the UHF portion is utilized. That is, when a diode is used as the UHF mixer 9, the impedance of the diode (that is the mixer 9) varies from a capacitive value to an inductive value so as to affect the above-mentioned matching characteristic, resulting in increase in loss as well as in deterioration in noise factor.

SUMMARY OF THE INVENTION

An object of the present invention is, therefore, to eliminate the above-mentioned drawback of the conventional UHF-VHF combination tuner.

Another object of the present invention is to provide a UHF-VHF combination tuner in which the impedance mismatching which occurs when a diode mixer is used in the UHF portion is corrected by utilizing a coil which serves as a peaking coil in the case of the VHF high channel reception.

DESCRIPTION OF PREFERRED EMBODIMENT

Figure 1:
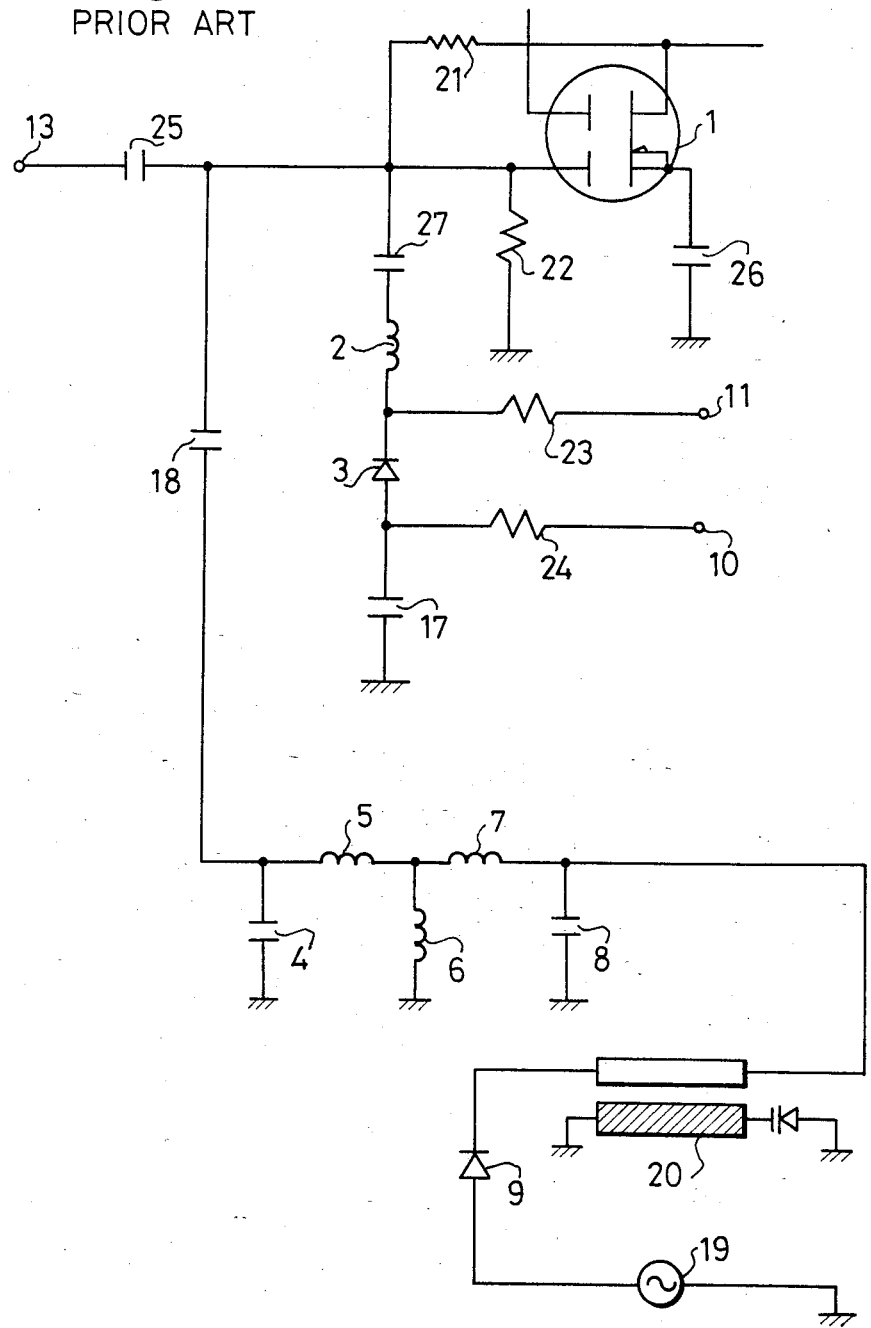
FIG. 1 is a circuit diagram of a conventional UHF-VHF combination tuner.
Figure 2:
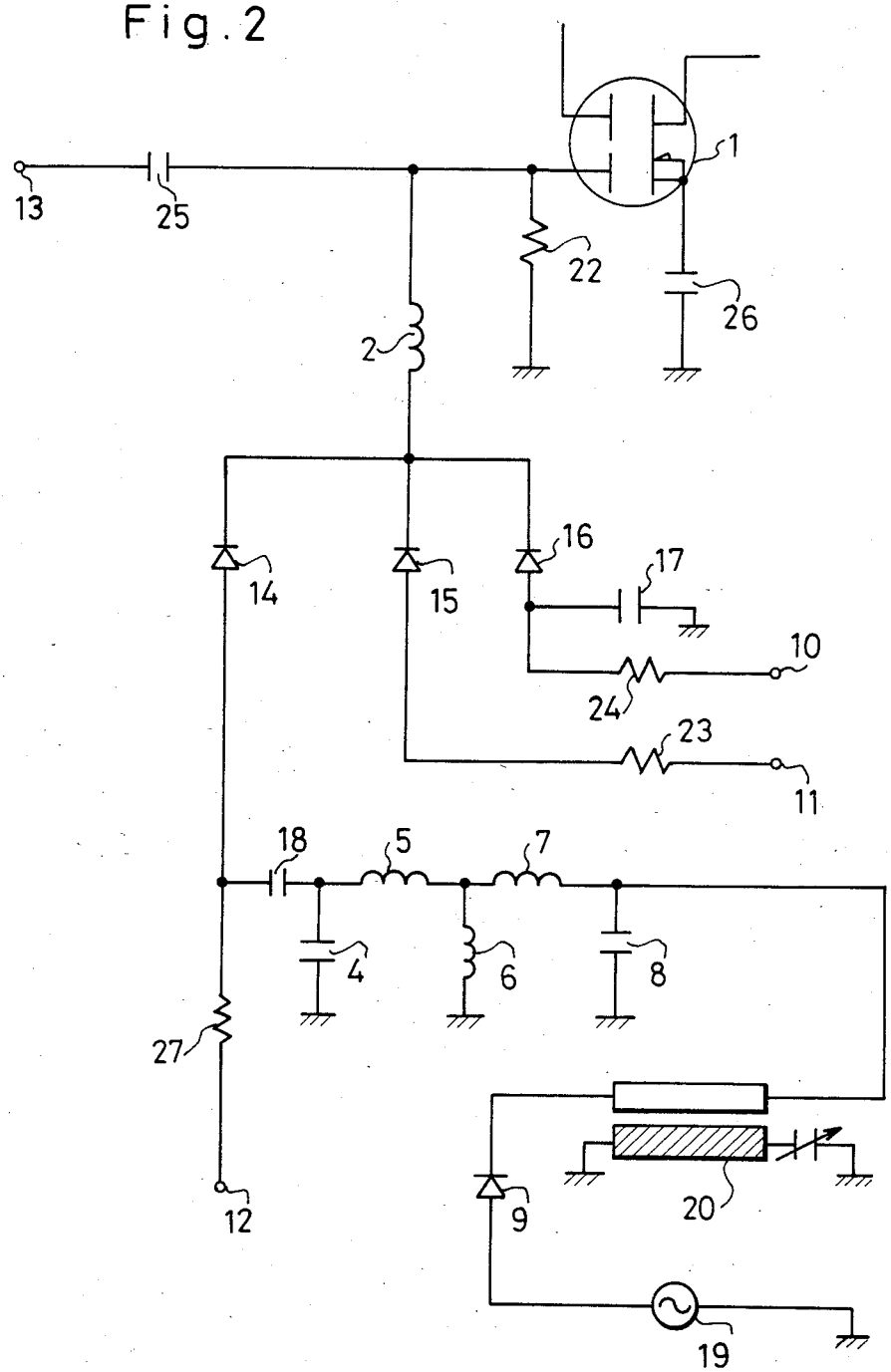
FIG. 2 is a circuit diagram of an embodiment of the UHF-VHF combination tuner according to the present invention.

Referring to FIG. 2, a preferred embodiment of the present invention in which the above-mentioned drawback of the conventional one is improved will be now described. In FIG. 2, the components designated by the reference numerals 1, 2, 4, 5, 6, 7, 8, 9, 10, 11, 13, 17, 18, 19, 20, 22, 23, 24, 25, and 26 correspond to those designated by the same reference numerals in FIG. 1, while reference numeral 12 designates a DC voltage application terminal in the case of UHF channel reception, 14, 15, and 16 designate switching diodes and 27 designates a resistor.

The UHF-VHF combination tuner as shown in FIG. 2 operates as follows:

[I] VHF Low Channel Reception:

A DC voltage is applied to the terminal 11 as shown in the drawing and a proper bias is applied to the gate G1 of the mixer stage 1 through the circuit of the resistor 23, the diode 15, the coil 2, and the resistor 22. The diodes 14 and 16 are in their off-state. A VHF input signal is supplied to the terminal 13 is mixed in the mixer stage 1. This state is not different, substantially, from that in the case of FIG. 1.

[II] VHF High Channel Reception:

A DC voltage is applied to the terminal 10 shown in the drawing and a bias suitable for this reception is applied to the gate G1 of the mixer stage 1 through the circuit of the resistor 24, the diode 16, the coil 2, and the resistor 22. Under this condition, the coil 2 is grounded with respect to high frequencies through the capacitor 17 to thereby operate as a peaking coil similarly to the case of FIG. 1, because the diode 16 is in its on-state while the diodes 14 and 15 are in their off-state.

[III] UHF Channel Reception:

In this case, a DC voltage is applied to the terminal 12 shown in the drawing and a proper bias is applied to the gate G1 of the mixer stage 1 through the circuit of the resistor 27, the diode 14, the coil 2, and the resistor 22. At this time, the diode 14 is in its on-state while the diodes 15 and 16 are in their off-state, and therefore the intermediate frequency from the UHF intermediate frequency tuning circuit (4, 5, 6, 7, 8) is supplied to the gate G1 of the mixer stage 1 which operates as a UHF intermediate frequency amplifier. That is, similarly to the case of FIG. 1, a UHF input signal is coupled to the UHF mixer 9 through a not-shown arrangement. This UHF input signal is mixed in the mixer 9 with the frequency of the UHF local oscillator circuit 19 and led to the UHF intermediate frequency tuning circuit constituted by the components 4, 5, 6, 7, and 8, through the UHF mixer tuning circuit 20. The UHF intermediate frequency is then produced from the UHF intermediate frequency tuning circuit and led to the gate G1 of the mixer stage 1 through the capacitor 18, the diode 14, and the coil 2.

In the arrangement as shown in FIG. 2, the capacitor 4 is made to have a larger capacitance than the capacitor 4 in FIG. 1 so that the capacitor 4 and the coil 2 to constitute a low-pass filter. Therefore, the impedance when the mixer stage 1 is viewed from the non-grounded terminal of the capacitor 4 is made to be smaller in comparison with the case of FIG. 1 and it becomes possible to correct the mis-matching between the intermediate frequency tuning circuit and the next stage including the mixer stage 1 in the case of the UHF channel reception, therebu making it possible to improve the noise factor.

Figure 3:
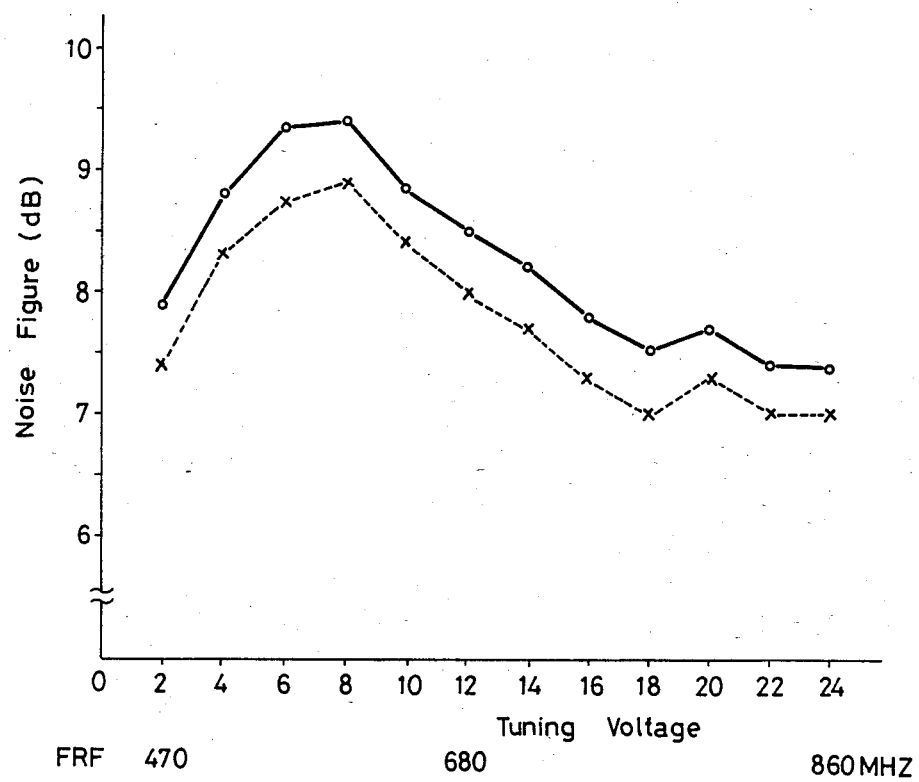
FIG. 3 is a characteristic diagram illustrating the comparison between the conventional UHF-VHF combination tuner as shown in FIG. 1 and the embodiment of the invention as shown in FIG. 2.

FIG. 3 is a characteristic diagram in which the noise factor in the case of the UHF channel reception is plotted in comparison between the conventional case of FIG. 1 and the case of the embodiment as shown in FIG. 2. The abscissa represents the tuning voltage which corresponds to the tuned frequency shown below, while the ordinate represents the noise factor in [dB]. In FIG. 3, the solid line connecting white dots represents the conventional case of FIG. 1 and the dotted line connecting x-marks represents the case of the embodiment of FIG. 2. As seen from the drawing, the noise factor is improved by about 0.5 [dB] in the case of embodiment according to the present invention.

As described above, according to the present invention, the coil 2 which operates as a peaking coil in the case of the VHF high channel reception constitutes a low-pass filter together with the capacitor 4 in the case of the UHF channel reception so as to provide proper impedance matching, resulting in improvement in noise factor in the case of the UHF channel reception.

What is claimed is:

1. A UHF-VHF combination tuner for receiving low-range VHF, high-range VHF, and UHF signals comprising:

a VHF tuner;

a first mixer stage coupled to the VHF tuner, where the first mixer stage operates as a mixer for the VHF tuner when low-range VHF or high-range VHF signals are being received, and operates as an IF amplifier when UHF signals are being received, said first mixer stage having a first input terminal;

a bias resistor connected to the first input terminal;

a coil having a first end connected to the first input terminal, said coil forming a resonance circuit together with the inherent input capacitance of said first input terminal of the first mixer stage when high-range VHF signals are being received;

a first switching diode connected to a second end of the coil, where said first switching diode is biased in a conducting state when high-range VHF signals are being received so that the coil forms a resonance circuit together with said inherent input capacitance of the first input terminal, and where said first switching diode is in a high impedance state when high-range VHF signals are not being received;

a UHF tuner coupled to the second end of said coil so that the coil operates as a low-pass filter in series with an output of said UHF tuner and the first input terminal of said first mixer stage.

2. A UHF-VHF combination tuner according to claim 1 further comprising a second switching diode in series with the coil and an output of said UHF tuner.

3. A UHF-VHF combination tuner according to claim 2 wherein the second switching diode is in a conducting state when UHF signals are being received and in a high impedance state when UHF signals are not being received.

4. A UHF-VHF combination tuner according to claim 3 wherein the UHF tuner comprises a diode mixer.

5. A UHF-VHF combination tuner according to claim 3 wherein the first mixer stage comprises a dual gate FET.

* * * * *